(12) United States Patent
Wang

(10) Patent No.: US 11,327,452 B2
(45) Date of Patent: May 10, 2022

(54) CONTROL METHOD AND ELECTRONIC DEVICE WITH REMOVABLE COMPONENTS

(71) Applicant: Lenovo (Beijing) Co., Ltd., Beijing (CN)

(72) Inventor: Tianyu Wang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 152 days.

(21) Appl. No.: 16/723,755

(22) Filed: Dec. 20, 2019

(65) Prior Publication Data

US 2020/0201274 A1 Jun. 25, 2020

(30) Foreign Application Priority Data

Dec. 21, 2018 (CN) .......................... 201811572070.9

(51) Int. Cl.
*G05B 19/04* (2006.01)
*H05K 13/08* (2006.01)
*G01R 31/27* (2006.01)

(52) U.S. Cl.
CPC ........... *G05B 19/04* (2013.01); *G01R 31/275* (2013.01); *H05K 13/0882* (2018.08)

(58) Field of Classification Search
CPC .................................................... G05B 19/04
USPC ........................................................ 700/121
See application file for complete search history.

(56) References Cited

U.S. PATENT DOCUMENTS

| 10,564,686 | B2* | 2/2020 | Lee ..................... G06F 1/206 |
| 2011/0320161 | A1* | 12/2011 | Dolbec .................. G06F 1/206 |
| | | | 702/132 |
| 2013/0294029 | A1* | 11/2013 | Guo ...................... F04D 27/004 |
| | | | 361/695 |
| 2015/0378403 | A1* | 12/2015 | Chen ..................... G05B 15/02 |
| | | | 700/282 |
| 2017/0336839 | A1* | 11/2017 | Ho ........................ G05B 19/406 |
| 2019/0206157 | A1* | 7/2019 | Cazalis .............. G07C 9/00174 |

FOREIGN PATENT DOCUMENTS

| CN | 102065665 A | 5/2011 |
| CN | 201876792 U | 6/2011 |
| CN | 103257907 A | 8/2013 |
| CN | 107357708 A | 11/2017 |
| CN | 107479830 A | 12/2017 |
| CN | 107969099 A | 4/2018 |

\* cited by examiner

*Primary Examiner* — Md Azad
(74) *Attorney, Agent, or Firm* — Anova Law Group, PLLC

(57) ABSTRACT

A control method includes: determining a first state of a plurality of components in an electronic device; acquiring a first operating state of the electronic device; and determining whether to allow one or more of the plurality of components to be removed based on the first state of the plurality of components and the first operating state of the electronic device.

16 Claims, 8 Drawing Sheets

CONTROL METHOD AND ELECTRONIC DEVICE WITH REMOVABLE COMPONENTS

CROSS-REFERENCE TO RELATED APPLICATION

This application claims the priority to Chinese Patent Application No. 201811572070.9, entitled "Control Method and Electronic Device," filed on Dec. 21, 2018, the entire content of which is incorporated herein by reference.

TECHNICAL FIELD

The present disclosure relates to the field of information processing technology, and more particularly to a control method and an electronic device.

BACKGROUND

Currently, various components are disposed on an electronic device, and certain types of components may include a plurality of components. Often, the user has a need to remove one or more components from the electronic device. For example, a fan of an electronic device is disposed in the electronic device by hot plugging, and the user can remove the fan without turning off the electronic device or switching the power.

However, when the user removes too many components from the electronic device, it is likely to cause the system to break down, thereby impairing normal operations of the electronic device.

SUMMARY

In one aspect of the present disclosure, a control method is provided. The control method includes: determining a first state of a plurality of components in an electronic device; acquiring a first operating state of the electronic device; and determining whether to allow one or more of the plurality of components to be removed based on the first state of the plurality of components and the first operating state of the electronic device.

In some embodiments, the control method further includes maintaining a locking mechanism in an unlocked state, in response to one or more of the plurality of components being allowed to be removed.

In some embodiments, the control method further includes moving a locking mechanism to be into a locked state from an unlocked state by a control mechanism, in response to none of the plurality of components being allowed to be removed.

In some embodiments, the control method further includes unlocking a locking mechanism from a locked state by a control mechanism, in response to one or more of the plurality of components being allowed to be removed.

In some embodiments, the control method further includes maintaining a locking mechanism in a locked state, in response to none of the plurality of components being allowed to be removed.

In some embodiments, the component includes a cooling device. The method further includes determining that one of a first number of cooling devices are in a normal operating state in the electronic device and a second number of cooling devices are in an abnormal operating state.

According to certain aspect of the present disclosure, one or more of the plurality cooling devices in the electronic device are allowed to be removed in response to a heat dissipation requirement of the electronic device being met by heat dissipation capacity of the plurality of cooling devices in the electronic device.

In some embodiments, the component includes a memory. The method further includes determining a storage capacity of a plurality of memories in the electronic device.

According to certain aspect of the present disclosure, one or more memories in the electronic device are allowed to be removed based on a satisfaction of a storage requirement of the electronic device by the storage capacity of the plurality of memories in the electronic device.

In some embodiments, the control method further includes determining a first component in the plurality of components to be at least one of: abnormally and damaged; and controlling the first component to eject.

In another aspect of the present disclosure, an electronic device is provided. The electronic device includes a plurality of components and a processor. The processor is configured to: determine a first state of the plurality components disposed in the electronic device and being removable from the electronic device; acquire a first operating state of the electronic device; and determine whether to allow one or more of the plurality of components to be removed based on the first state of the plurality of components and the first operating state of the electronic device.

In some embodiments, the electronic device further includes a locking mechanism and a control mechanism. The processor is further configured to maintain a state of the locking mechanism and control an action of the control mechanism.

In some embodiments, the processor maintains an unlocked state of the locking mechanism in response to one or more of the plurality components being allowed to be removed and the locking mechanism is in an unlocked state.

In some embodiments, the processor controls the control mechanism to move the locking mechanism to be into a locked state in response to none of the plurality of components being allowed to be removed and the locking mechanism being in an unlocked state In some embodiments, the processor controls the control mechanism to move the locking mechanism to be into an unlocked state in response to one or more of the plurality of components being allowed to be removed and the locking mechanism being in a locked state.

In some embodiments, the processor maintains a locked state of the locking mechanism in response to none of the plurality of components being allowed to be removed and the locking mechanism being in a locked state.

In some embodiment, the component includes a cooling device.

In some embodiment, the processor determines one of: a first number of cooling devices in a normal operating state in the electronic device and a second number of cooling devices in an abnormal operating state; and one or more of a plurality cooling devices in the electronic device are allowed to be removed in response to a heat dissipation requirement of the electronic device being met by heat dissipation capacity of the plurality of cooling devices in the electronic device.

In some embodiments, the component includes a memory.

In some embodiments, the processor determines a storage capacity of a plurality of memories in the electronic device; and one or more of the plurality of memories is allowed to be removed in response to a storage requirement of the electronic device being met by the storage capacity of the plurality of memories in the electronic device.

The above aspects will be described in detail with accompanying drawings.

BRIEF DESCRIPTION OF THE DRAWINGS

In order to more clearly illustrate the technical solutions provided by the present disclosure, the drawings used in the description of the embodiments will be briefly described below.

DETAILED DESCRIPTION OF THE EMBODIMENTS

The technical solutions in the embodiments of the present disclosure are clearly and completely described in the following, with reference to the accompanying drawings in the embodiments of the present disclosure. It is obvious that the described embodiments are only a part of the embodiments of the present disclosure, but not all embodiments. All other embodiments obtained by those skilled in the art based on the embodiments of the present disclosure without creative efforts are within the scope of the present disclosure.

Figure 1:
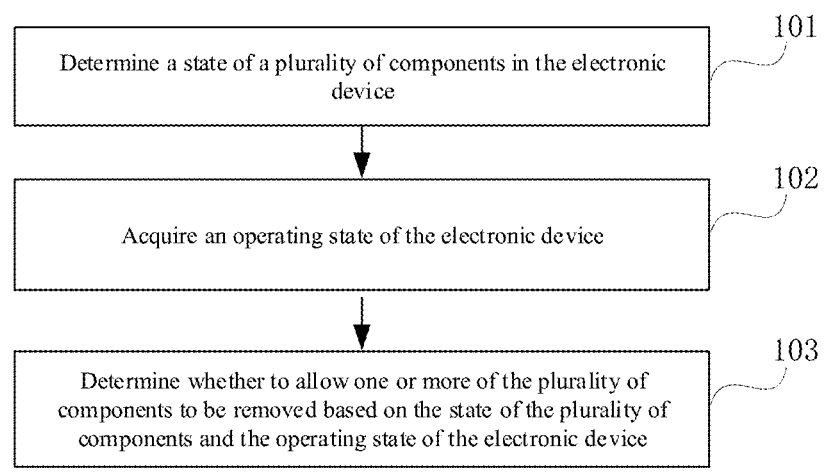
FIG. 1 is a first schematic flow chart of a control method according to certain embodiments of the present disclosure.

According to certain embodiments of the present disclosure, a control method is provided. As shown in FIG. 1, the method may include the following steps:

Step 101: Determine a state of a plurality of components in the electronic device.

The plurality of components can be disposed in the electronic device and can be removed from the electronic device.

In the present disclosure, a plurality of types of components can be disposed in the electronic device, and specifically, the state of the plurality of types of components in the electronic device may be determined. For example, a plurality of cooling devices may be disposed in the electronic device, and the state of the plurality of cooling devices may be determined; also, a plurality of memories may be disposed in the electronic device, and the state of the plurality of memories may be determined.

The state of the component may at least include the number of components that can be disposed in the electronic device.

Step 102: Acquiring an operating state of the electronic device.

According to the present disclosure, different types of components correspond to different operating states of the electronic device.

Step 103: Determining whether to allow one or more of the plurality components to be removed based on a state of the one or more components and an operating state of the electronic device.

Based on the operating state of the electronic device and the state of the component, it can be determined whether to currently allow the component to be removed from the electronic device. For example, based on the operating state of the electronic device, when it is determined that the number of components that can be disposed in the electronic device exceeds the number required for the normal operation of the electronic device, then removing one or more of the plurality of components may be allowed; if, based on the operating state of the electronic device, the number of components that can be disposed in the electronic device does not exceed the number required for the normal operation of the electronic device, and then removing one or more of the plurality of components may not be allowed.

It should be noted that, when it is determined that removing the component from the electronic device is allowed, the number of components allowed to be removed may not be limited; when the number of components in the electronic device is decreased, cyclically performing a control method of the present disclosure to determine whether to allow removing one or more of the plurality of components, based on the state of the one or more of the plurality of components and the operating state of the electronic device.

Alternatively, when it is determined that removing one or more of the plurality of components is allowed, the number of components allowed to be removed may be directly limited, and the number of components that can be removed may be based on the number of components that can be disposed in the electronic device and the number required for the normal operation of the electronic device; that is, the number of components that can be disposed in the electronic device subtracted by the number of components required for normal operation of the electronic device, equals to the number of the components that can be removed from the electronic device.

Thus, according to certain embodiments, the control method may include: determining a state of a plurality of components in the electronic device; acquiring an operating state of the electronic device; and determining, based on the state of the plurality of components and the operating state of the electronic device, whether to allow one or more of the plurality of components to be removed. The plurality of components may be disposed in the electronic device and can be removed from the electronic device. Accordingly, in the present disclosure, it can be automatically determined whether to allow a component to be removed, and the user cannot remove it if it is not allowed, thereby ensuring the normal operation of the electronic device.

Figure 2:
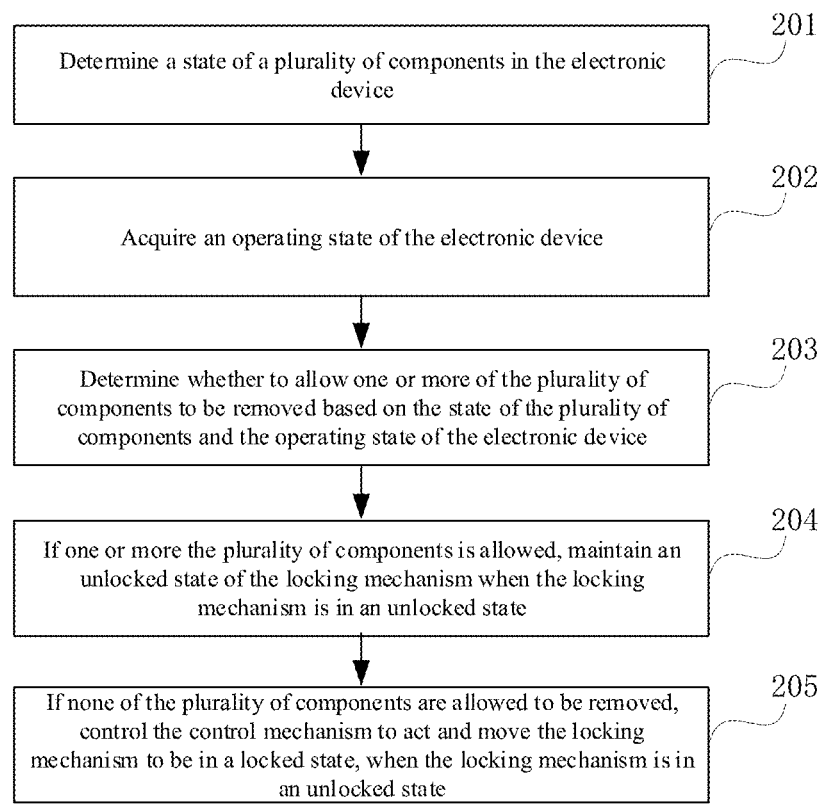
FIG. 2 is a second schematic flowchart of a control method according to certain embodiments of the present disclosure.

In some embodiments, another control method is provided. As shown in FIG. 2, the method may include the following steps:

Step 201: Determining a state of a plurality of components in the electronic device.

The plurality of components can be disposed in the electronic device and can be removed from the electronic device.

Step 202: Acquiring an operating state of the electronic device.

Step 203: Determining whether to allow one or more components to be removed, based on the state of the plurality of components and the operating state of the electronic device.

Step 204: If one or more components is allowed to be removed, maintaining an unlocked state of a locking mechanism when the locking mechanism is in an unlocked state;

The locking mechanism of the present disclosure may be configured for locking a component in a locked state to prevent the component from being removed from the electronic device, and the component can be removed from the electronic device when the locking mechanism is in an unlocked state. Then, when the unlocked state of the locking mechanism is maintained, the component can be removed from the electronic device.

It should be noted that, when it is determined that a component is allowed to be removed from the electronic device, the number of components allowed to be removed may not be limited, and the unlocked state of the locking mechanism for each component may be maintained. Under this circumstance, all components can be controlled by one locking mechanism, or a locking mechanism is disposed at each component.

Alternatively, when it is determined that one or more of the plurality of components may be allowed to be removed, the number of components allowed to be removed may be directly limited, and the number of components that can be removed may be based on the number of components that can be disposed in the electronic device and the number required for the normal operation of the electronic device; that is, the number of components that can be disposed in the electronic device subtracted by the number of components required for the normal operation of the electronic device. Then, a locking mechanism is disposed at each component, and by maintaining the unlocked state of the locking mechanisms in accordance with the number of components allowed to be removed, other locking mechanisms are maintained in the locked state.

Step 205: If removing one or more components is not allowed, a control mechanism may be controlled to cause the locking mechanism to be in a locked state when the locking mechanism is in the unlocked state.

The control mechanism may be configured to control the locking mechanism, and to cause the locking mechanism to be in a locked state by a first action when the locking mechanism is in an unlocked state; and of course, to cause the locking mechanism to be in an unlocked state by a second action when the locking mechanism is in a locked state. When the locking mechanism in the unlocked state is caused to be in a locked state by controlling the control mechanism, the component cannot be removed from the electronic device.

In some embodiments, step 204 and step 205 may be both included. In other embodiments, steps 201-204 may be included other than step 205; or, in other embodiments, steps 201-203 and step 205 may be included other than step 204.

Figure 3:
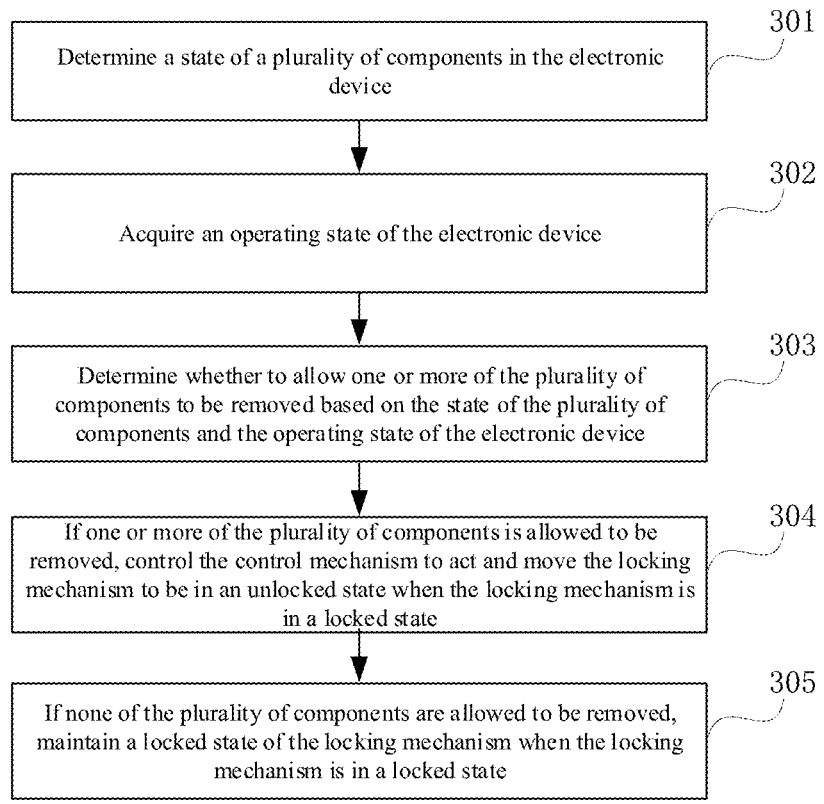
FIG. 3 is a third schematic flowchart of a control method according to certain embodiments of the present disclosure.

In some embodiments, another control method is provided. As shown in FIG. 3, the method may include the following steps:

Step 301: Determining a state of a plurality of components in the electronic device.

The plurality of components can be disposed in the electronic device and can be removed from the electronic device.

Step 302: Acquiring an operating state of the electronic device.

Step 303: Determining whether to allow one or more components to be removed based on the state of the plurality of components and the operating state of the electronic device.

Step 304: If one or more of the plurality of components is allowed to be removed, a control mechanism may be controlled to cause the locking mechanism to be in an unlocked state when the locking mechanism is in a locked state.

The locking mechanism of the present disclosure may be configured for locking the component in the locked state to prevent the component from being removed from the electronic device, and the component can be removed from the electronic device when the locking mechanism is in the unlocked state. The control mechanism may be configured to control the locking mechanism and cause the locking mechanism to be in the locked state by a first action when the locking mechanism is in the unlocked state, and to cause the locking mechanism to be in the unlocked state by a second action when the locking mechanism is in the locked state. When the locking mechanism in the locked state is caused to be in the unlocked state by controlling the control mechanism, the component can be removed from the electronic device.

It should be noted that, when it is determined that a component may be allowed to be removed from the electronic device, the number of components allowed to be removed may not be limited, and the locking mechanism for each component may be in an unlocked state. Under this circumstance, all components can be controlled by a locking mechanism, or a locking mechanism is disposed at each component.

Alternatively, when it is determined that one or more components may be allowed to be removed, the number of components allowed to be removed may be directly limited. The number of components that can be removed may be based on the number of components that can be disposed in the electronic device and the number required for the normal operation of the electronic device; that is, the number of components that can be disposed electronic device subtracted by the number of components required for the normal operation of the electronic device. Then, a locking mechanism may be disposed at each component to control the control mechanism, to maintain the unlocked state of the locking mechanisms in accordance with the number of components allowed to be removed, and maintain the other locking mechanisms in the locked state.

Step 305: If removing one or more of the plurality of components is not allowed, the locked state of the locking mechanism may be maintained when the locking mechanism is in the locked state.

The component cannot be removed from the electronic device by maintaining the locked state of the locking mechanism.

It should be noted that, in some embodiments, step 304 and step 305 may be both included. In other embodiments, steps 301-304 may be included other than step 305; or, in other embodiments, steps 301-303 and step 305 may be included rather than step 304.

Figure 4:
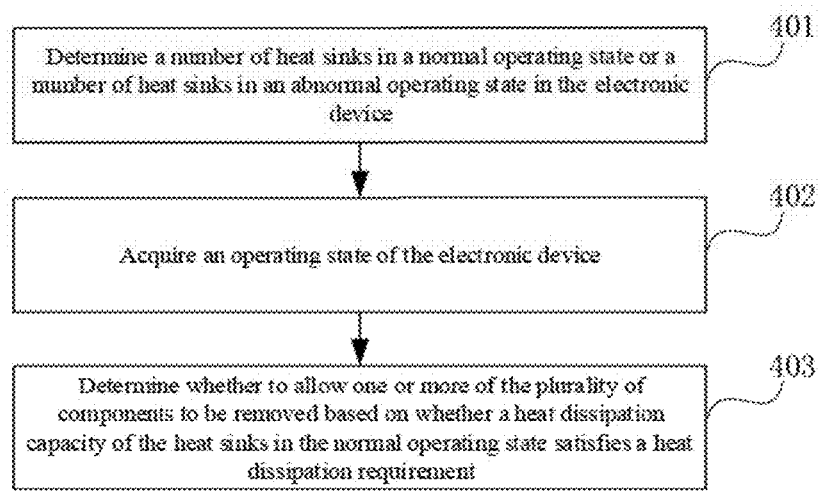
FIG. 4 is a fourth schematic flowchart of a control method according to certain embodiments of the present disclosure.

In some embodiments, another control method is provided. The component may include a cooling device, and specifically, a fan. As shown in FIG. 4, the method may include the following steps:

Step 401: Determining a number of cooling devices currently in a normal operating state or a number of cooling devices in an abnormal operating state in the electronic device.

A cooling device in a normal operating state may include a cooling device that is not removed and operates properly.

A cooling device in an abnormal operating state may include a cooling device that is removed and a cooling device that does not operate properly.

When a cooling device does not operate properly in the electronic device or is removed from the electronic device, the electronic device can record the number of cooling devices in abnormal operating states. The number of cooling devices in the normal operating state can be derived by subtracting the total number of cooling devices in the electronic device by the number of cooling devices in the abnormal operating state. Or, directly counting the number of the cooling devices in the electronic device currently in the normal operating state or the number of the cooling devices in the abnormal operating state, to obtain the number of the cooling devices in the normal operating state or the number of the cooling devices in the abnormal operating state.

Figure 5:
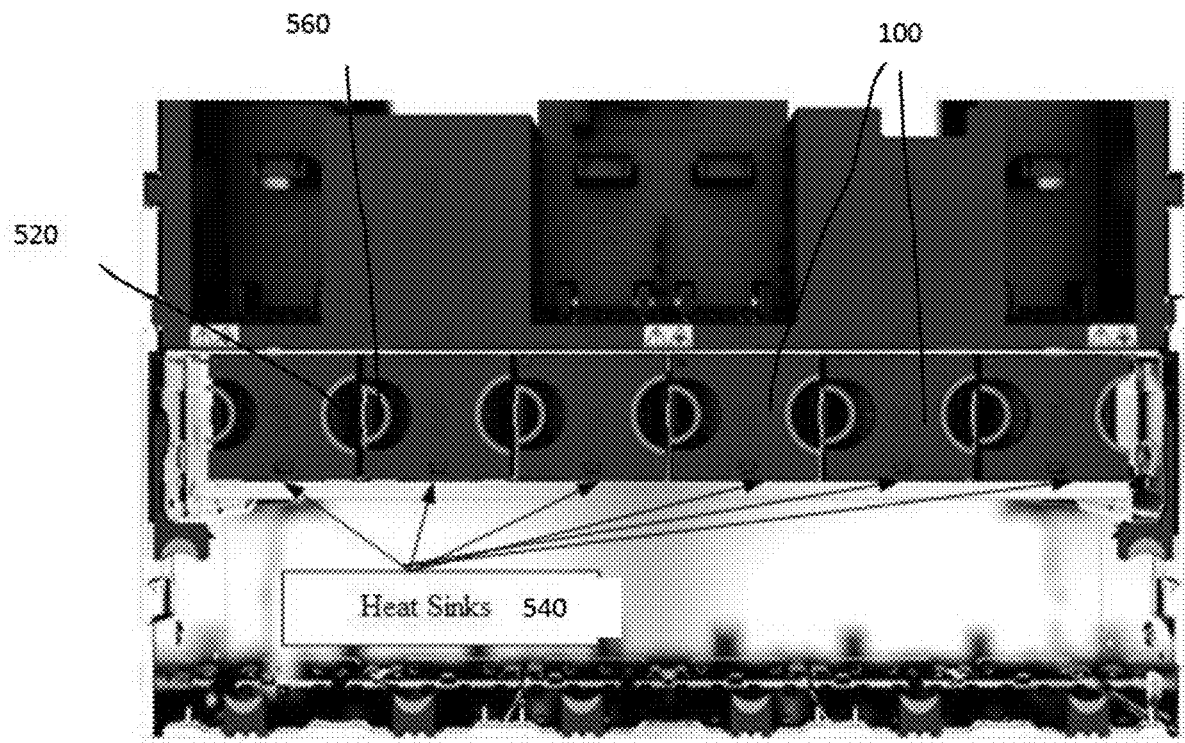
FIG. 5 is a schematic diagram of a placement position of a cooling device in an electronic device according to certain embodiments of the present disclosure.

A disposition of a cooling device in the electronic device can be referred to FIG. 5. As shown in FIG. 5, six cooling devices (100) may be disposed in the electronic device near each heat sink 540. For each cooling device 100, for example, a semi-circle recess 520 with a snap-hook is configured at the external casing of each cooling device 100. When the semi-circle recess 520 is pressed, it releases the snap-hook (not shown) so that if a locking mechanism 400 (shown later in FIGS. 11 and 12) unlocks the cooling device 100, it allows the cooling device to be removed. The semi-circle recess 520 and another semi-circle recess 560, both configured at the external casing of each cooling device 100, allow a thumb and a finger hold the cooling device out of the electronic device.

Step 402: Acquiring an operating state of the electronic device.

The operating state of the electronic device may be used to characterize a current heat dissipation requirement of the electronic device.

Step 403: Determining whether to allow one or more of a plurality of cooling devices to be removed based on whether the heat dissipation capacity of the cooling devices in the normal operating state satisfies the heat dissipation requirement.

Based on whether the heat dissipation capacity of the cooling devices in the normal operating state satisfies the heat dissipation requirement, determine whether to allow one or more of the plurality of cooling devices to be removed.

Specifically, based on whether the heat dissipation capacity of the cooling devices in the normal operating state satisfies the heat dissipation requirement, determining whether to allow one or more of the plurality of cooling devices to be removed may include: determining whether the number of cooling devices currently in the normal operating state in the electronic device is greater than the number of the normal cooling devices required by the electronic device. If greater than, indicating that removing one or more of the plurality of cooling devices may be allowed; if less than or equal to, indicating that removing one or more of the plurality of cooling devices may not be allowed.

The number of the normal cooling devices required by the electronic device can be preset in the system. When removals are allowed and if the number of the allowed removals is limited, then the number of the allowed removals can be determined by the number of the cooling devices currently in the normal operating state subtracted by the number of the normal cooling devices required by the electronic device.

Or, based on whether the heat dissipation capacity of the cooling devices in the normal operating state satisfies the heat dissipation requirement, determining whether to allow one or more cooling devices to be removed may include: determining whether the number of the cooling devices in the electronic device currently in the abnormal operating state is less than the number of abnormal fans allowed by the electronic device. If less than, indicating that removing one or more of the plurality of cooling devices may be allowed; if greater than or equal to, indicating that removing one or more of the plurality of cooling devices may not be allowed.

The number of abnormal fans allowed by the electronic device can be preset in the system. When removals are allowed and if the number of removals is limited, then the number of the allowed removals can be determined by the number of the abnormal fans allowed by the electronic device subtracted by the number of the fans currently in the abnormal operating state in the electronic device.

Figure 6:
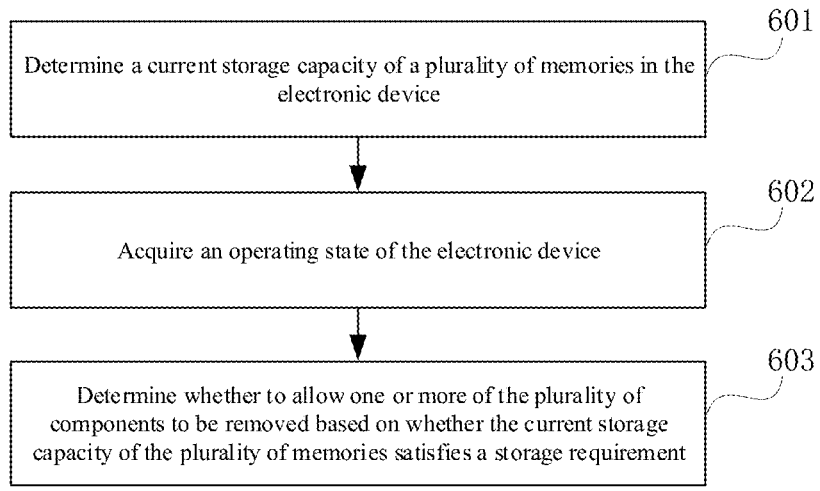
FIG. 6 is a fifth schematic flowchart of a control method according to certain embodiments of the present disclosure.

In some embodiments, another control method is provided. In this embodiment, the component may include a memory. As shown in FIG. 6, the method may include the following steps:

Step 601: Determining a current storage capacity of a memory in the electronic device.

The current storage capacity of the memory is the total current storage capacities of all memories that are disposed in the electronic device. For example, in a cloud storage pool, an electronic device may aggregate storage resources together to perform a unified processing.

Step 602: Acquiring an operating state of the electronic device.

The operating state of the electronic device may be used to characterize the storage requirement of the electronic device.

Step 603: Determining whether to allow one or more of a plurality of memories to be removed based on whether the current storage capacity satisfies the storage requirement.

If the current storage capacity can satisfy the storage requirement of the electronic device, one or more of the plurality of memories may be allowed to be removed.

If the current storage capacity cannot satisfy the storage requirement of the electronic device, then removing one or more of the plurality of memories may be prohibited.

Specifically, the storage requirement of the electronic device may be represented by the storage requirement of the electronic device, that is, determining whether the current storage capacity is greater than the storage requirement of the electronic device. If current storage capacity is greater than the storage requirement of the electronic device, removing one or more of the plurality of memories may be allowed. If the current storage capacity is less than or equal to the storage requirement of the electronic device, removing one or more of the plurality of memories may not be allowed.

It should be noted that, in some embodiments, when removals are allowed, the amount of the allowed removals may be limited; that is, the current storage capacity subtracted by the storage requirement of the electronic device equals to an extra storage. Determine the amount of memories allowed to be removed based on the extra storage and a nominal storage capacity of each memory.

Figure 7:
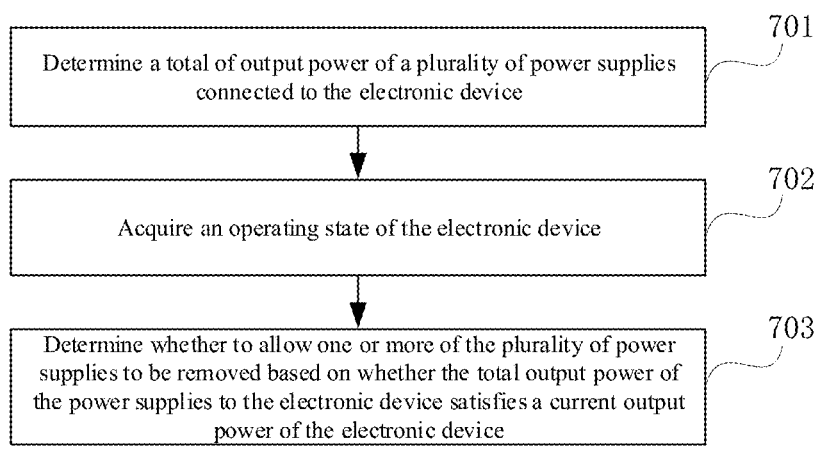
FIG. 7 is a seventh schematic flowchart of a control method according to certain embodiments of the present disclosure.

The components in the present disclosure may not be limited to the cooling devices and the memories described in the foregoing embodiments, and may also be other types of components, i.e., power supply. According to certain embodiments of the present disclosure, as shown in FIG. 7, the method may include the following steps:

Step 701: Determining a total output power of power supplies in the electronic device.

The total output power of the power supplies is the sum of the output power of all the power supplies connected to the electronic device.

Step 702: Acquiring an operating state of the electronic device.

The operating state of the electronic device may be used to characterize the current output power of the electronic device.

Step 703: Determining whether to allow one or more of the plurality of power supplies to be removed, based on whether the total output power of the power supplies in the electronic device satisfies the current output power of the electronic device. That is, when the total output power is greater than the current output power, removing one or more of the plurality of power supplies may be allowed; when the total output power is less than or equal to the current output power, removing one or more of the plurality of power supplies may be prohibited.

Figure 8:
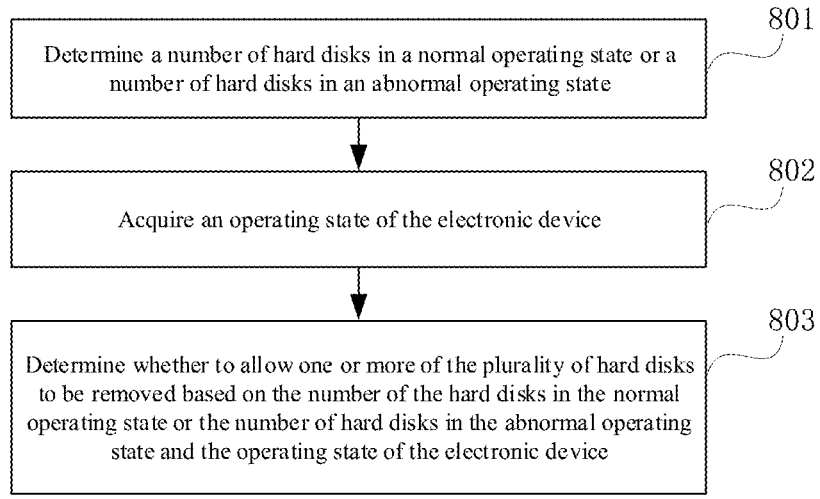
FIG. 8 is an eighth schematic flowchart of a control method according to certain embodiment of the present disclosure.

In some embodiments, the component may include a hard disk. As shown in FIG. 8, the method may include the following steps:

Step 801: Determining the number of hard disks currently in a normal operating state or the number of hard disks in an abnormal operating state in the electronic device;

Step 802: Acquiring an operating state of the electronic device.

Step 803: Determining whether to allow one or more of the plurality of hard disks to be removed, based on the number of the hard disks currently in the normal operating state or the number of the hard disks in the abnormal operating state and the operating state of the electronic device.

A hard disk in a normal operating state may include a hard disk that is not removed and operates properly.

A hard disk in an abnormal operating state may include a hard disk that is removed and a hard disk that does not operate properly.

Specifically, the operating state of the electronic device may include the required number of normal hard disks; then determining whether the number of the hard disks currently in the normal operating state is greater than the number of the normal hard disks required by the electronic device. If greater than, indicating that removing one or more of the plurality of hard disks may be allowed; if less than or equal to, indicating removing one or more of the plurality of hard disks may not be allowed.

Specifically, the operating state of the electronic device may include the allowed number of abnormal hard disks; then determining whether the number of the hard disks currently in the abnormal operating state in the electronic device is less than the allowed number of abnormal hard disks in the electronic device. If less than, indicating that removing one or more of the plurality of hard disks may be allowed; if it is greater than or equal to, indicating that removing one or more of the plurality of hard disks may not be allowed.

When a hard disk does not operate properly or a hard disk is removed from the electronic device, the electronic device can record the number of the hard disks in the abnormal operating state. The number of the hard disks in the normal operating state can be acquired based on the total number of the hard disks in the electronic device subtracted by the number of the hard disks in the abnormal operating state. Or, directly counting the number of the hard disks in electronic device currently in the normal operating state or the number of the hard disks in the abnormal operating state, to acquire the number of the hard disks currently in the normal operating state or the number of hard disks in the abnormal operating state.

It should be noted that the above-mentioned hard disks may be hard disks in which information is backed up by each other; that is, the information in one hard disk is backed up in another hard disk. Then, for a hard disk with key information stored in the electronic device and not backed up, the method may further include: prohibiting the first hard disk storing the key information from being removed; or determining whether the key information stored in the first hard disk is backed up in another hard disk, when a removal is allowed, the first hard disk may be allowed to be removed.

Figure 9:
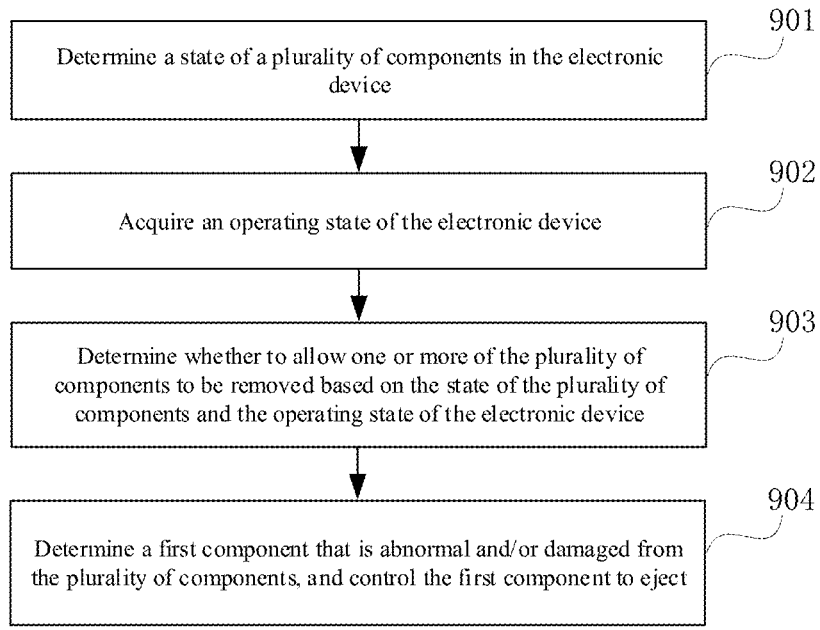
FIG. 9 is a ninth schematic flowchart of a control method according to certain embodiments of the present disclosure.

According to certain embodiments of the present disclosure, in order to prevent the components not operating properly from affecting the electronic device, as shown in FIG. 9, a control method may include the following steps:

Step 901: Determining a state of a plurality of components in the electronic device.

The plurality of components may be disposed in the electronic device and can be removed from the electronic device.

Step 902: Acquiring an operating state of the electronic device.

Step 903: Determining whether to allow one or more of the plurality of components to be removed based on the state of the plurality of components and the operating state of the electronic device;

Step 904: When it is determined that a first component from the plurality of components is abnormal and/or damaged, controlling the first component to eject.

When it is determined that a first component in the components is abnormal and/or damaged, directly controlling the first component to eject to remind the user to replace the component in time.

Corresponding to the foregoing mentioned control method, the present disclosure further provides an electronic device, which is described in detail below through several embodiments.

Figure 10:
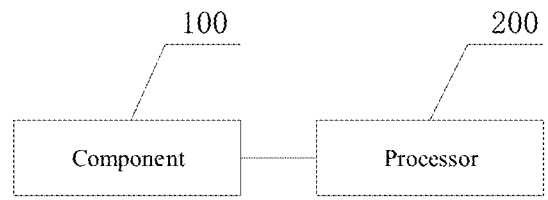
FIG. 10 is a first schematic structural diagram of an electronic device according to certain embodiments of the present disclosure.

According to certain embodiments, an electronic device is provided. As shown in FIG. 10, the electronic device may include: a component 100 and a processor 200. The component 100 may include a plurality of components 100. The plurality of components 100 can be disposed in the electronic device and can be removed from the electronic device.

In the present disclosure, a plurality of types of components can be disposed in the electronic device, and specifically, determining a state of the plurality of components. For example, a plurality of cooling devices may be disposed in the electronic device, and determining the state of the plurality of cooling devices; in another example, a plurality of memories may be disposed in the electronic device, and determining the state of the plurality of memories.

The state of the component may include at least the number of components that can be disposed the electronic device.

The processor 200 may be configured to determine a state of the plurality of components in the electronic device. Acquiring an operating state of the electronic device, determining, based on the state of the plurality of components and the operating state of the electronic device, determining whether to allow one or more of the plurality of components to be removed. One or more of the plurality of components may be disposed in the electronic device and can be removed from the electronic device.

In the present disclosure, different types of components correspond to different operating states of the electronic device.

Based on the operating state of the electronic device and the state of the component, it can be determined whether the component may currently be allowed to be removed from the electronic device. For example, the processor may determine that the number of components disposed in the electronic device exceeds the number required for the normal operation of the electronic device, based on the operating state of the electronic device, then removing one or more of the plurality of components may be allowed; if the processor determines that, based on the operating state of the electronic device, that the number of components disposed in the electronic device does not exceed the number required for the normal operation of the electronic device, then removing one or more of the plurality of components may not be allowed.

It should be noted that, when the processor determines that components may be allowed to be removed from the electronic device, the number of components allowed to be removed may not be limited. When the number of the components in the electronic device is decreased, the processor may cyclically perform the foregoing function and determine whether to allow one or more of the plurality of components to be removed based on the state of the plurality of components and the operating state of the electronic device.

Alternatively, when the processor determines one or more of the plurality of components may be removed, the number of components allowed to be removed may be directly limited. The number of components that can be removed may be based on the number of components that can be disposed the electronic device and the number required for the normal operation of the electronic device; that is, the number of components that can be disposed in the electronic device subtracted by the number of components required for the normal operation of the electronic device.

Accordingly, in some embodiment, the processor may determine a state of a plurality of components in the electronic device, acquire an operating state of the electronic device, and determine whether to allow one or more of the plurality of components to be removed based on the state of the plurality of components and the operating state of the electronic device. The plurality of components can be disposed in the electronic device and can be removed from the electronic device. Accordingly, in the present disclosure, it is possible to automatically determine whether a component may be allowed to be removed, and if not allowed, the user cannot remove it, which ensures the normal operation of the electronic device.

Figure 11:
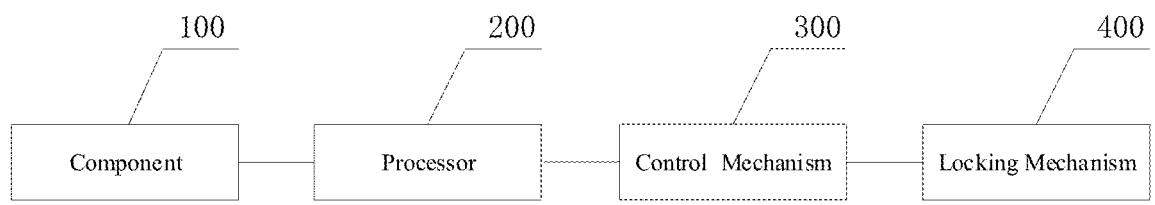
FIG. 11 is a second schematic structural diagram of an electronic device according to certain embodiments of the present disclosure.

In some embodiments, another electronic device is provided. As shown in FIG. 11, the electronic device may include: a component 100, a processor 200, a control mechanism 300, and a locking mechanism 400.

The processor 200 may be further configured to maintain an unlocked state of the locking mechanism 400 when the locking mechanism is in an unlocked state, if removing one or more of the plurality of components is allowed; or, control an action of the control mechanism 300 when the locking mechanism is in the unlocked state, to cause the locking mechanism 400 to be in the locked state, if removing one or more of the plurality of components is not allowed.

The locking mechanism 400 in the present disclosure may be configured to lock the component 100 in the locked state to prevent the component 100 from being removed from the electronic device, and the component 100 can be removed from the electronic device when the locking mechanism 400 is in the unlocked state. Thus, when the unlocked state of the locking mechanism 400 is maintained, the component 100 can be removed from the electronic device.

It should be noted that, when the processor 200 determines that the component 100 may be allowed to be removed from the electronic device, the number of components allowed to be removed may not be limited, and the unlocked state of the locking mechanism 400 for each component 100 may be maintained. Under this circumstance, all the components may be controlled by a locking mechanism 400, or a locking mechanism 400 may be disposed at each component.

Alternatively, when the processor 200 determines that one or more of the plurality of components 100 may be allowed to be removed, the number of components allowed to be removed may be directly limited. The number of components that can be removed may be based on the number of the components that can be disposed in the electronic device and the number required for the normal operation of the electronic device; that is, the number of components that can be disposed in the electronic device subtracted by the number of components required for the normal operation of the electronic device. Then, a locking mechanism may be disposed at each of the components, and by maintaining the unlocked state for the locking mechanisms in accordance with the number of components allowed to be removed, other locking mechanisms may be controlled to be in a locked state.

The control mechanism 300 may be configured to control the locking mechanism 400, and to cause the locking mechanism 400 to be in a locked state by a first action when the locking mechanism 400 is an unlocked state; and of course, to cause the locking mechanism 400 to be in an unlocked state by a second action when the locking mechanism 400 is in a locked state. After the processor 200 causes the locking mechanism 400 in an unlocked state to be in a locked state by controlling the control mechanism 300, the component 100 cannot be removed from the electronic device.

The processor 200 may be further configured to control the control mechanism 300 to act such that the locking mechanism 400 is in an unlocked state when removing one or more components is allowed and the locking mechanism 400 is in a locked state; or, to maintain the locked state of the locking mechanism 400 if removing one or more components is not allowed and when the locking mechanism 400 is in the locked state.

The locking mechanism of the present disclosure may be configured for locking a component in a locked state to prevent the component from being removed from the electronic device, and the component can be removed from the electronic device when the locking mechanism is in an unlocked state. The control mechanism may be configured to control the locking mechanism and cause the locking mechanism to be in the locked state by a first action when the locking mechanism is in the unlocked state; and of course, to cause the locking mechanism to be in the unlocked state by a second action when the locking mechanism is in the locked state. After the locking mechanism in the locked state is caused to be in the unlocked state by controlling the control mechanism, the component can be removed from the electronic device.

It should be noted that, when the processor determines that the component may be allowed to be removed from the electronic device, the number of components allowed to be removed may not be limited, and the locking mechanism for each component may be maintained in an unlocked state. Under this circumstance, all components may be controlled by one locking mechanism, or a locking mechanism may be disposed at each component.

Alternatively, when the processor determines that one or more components may not be removed, the number of components allowed to be removed may be directly limited. The number of components that can be removed may be based on the number of components that can be disposed the electronic device and the number required for the normal operation of the electronic device; that is, the number of components that can be disposed in the electronic device subtracted by the number of components required for the normal operation of the electronic device. Then, a locking mechanism may be disposed at each component, and the processor can control the control mechanism to act such that the locking mechanisms are maintained in the unlocked state in accordance with the number of components allowed to be removed and the other locking mechanisms are maintained in the locked state.

The processor may maintain the locked state of the locking mechanism such that the component cannot be removed from the electronic device.

In some embodiments, the component may include a cooling device. Correspondingly, the processor may be specifically configured to determine the number of cooling devices currently in a normal operating state or the number of cooling devices in an abnormal operating state in the electronic device, to obtain an operating state of the electronic device and to determine whether to allow one or more of a plurality of cooling devices to be removed based on whether the heat dissipation capability of the cooling devices currently in the normal operating state satisfies a heat dissipation requirement.

A cooling device in the normal operating state may include a cooling device that is not removed and operates properly.

A cooling device in an abnormal operating state may include a cooling device that is removed and a cooling device that does not operate properly.

When a cooling device does not operate properly or a cooling device is removed from the electronic device, the processor may record the number of cooling devices in the abnormal operating state. The number of cooling devices in the normal operating state can be derived based on the total number of cooling devices in the electronic device subtracted by the number of cooling devices in the abnormal operating state. Or, the processor may directly count the number of the cooling devices currently in the normal operating state subtracted by the number of the cooling devices in the abnormal operating state, to acquire the number of the cooling devices currently in the normal operating state or the number of the cooling devices in the abnormal operating state.

The processor may determine whether to allow one or more of the plurality of cooling devices to be removed, by determining whether the heat dissipation capacity of the cooling devices currently in the normal operating state satisfies the heat dissipation requirement of the electronic device.

Specifically, determining, by the processor, whether to allow one or more of the plurality of cooling devices to be removed, based on whether the heat dissipation capability of the cooling devices currently in the normal operating state satisfies the heat dissipation requirement may include: determining whether the number of the cooling devices currently in the normal operating state in the electronic device is greater than the number of normal cooling devices required by the electronic device; if greater than, indicating that removing one or more of the plurality of cooling devices may be allowed; if less than or equal to, indicating that removing one or more of the plurality of cooling devices may not be allowed.

When removals are allowed and if the number of the allowed removals is limited, the number of the allowed removals can be determined by the number of the cooling devices currently in the normal operating state subtracted by the number of the normal cooling devices required by the electronic device.

Alternatively, determining, by the processor, whether to allow one or more of the plurality of cooling devices to be removed, based on whether the heat dissipation capability of the cooling devices currently in the normal operating state satisfies the heat dissipation requirement may include: determining whether the number of cooling devices in the abnormal operating state is less than the allowed number of abnormal fans; if less than, indicating that removing one or more of the plurality of cooling devices may be allowed; if it is greater than or equal to, indicating that removing one or more of the plurality of cooling devices may not be allowed.

When removals are allowed and if the number of the allowed removals is limited, the number of the allowed removals can be determined by the number of the abnormal fans allowed by the electronic device subtracted by the number of the cooling devices currently in the abnormal operating state in the electronic device.

In some embodiments, the component may include a memory. Correspondingly, the processor may be specifically configured to determine a current storage capacity of the memory in the electronic device, acquire an operating state of the electronic device, and determine whether to allow one or more of a plurality of memories to be removed based on whether the current storage capacity satisfies a storage requirement.

The current storage capacity of the memory is the total storage capacity of all memories in the electronic device. For example, in a cloud storage pool, an electronic device may aggregate storage resources together to perform a unified processing.

The operating state of the electronic device may be used to characterize the storage requirement of the electronic device.

If the current storage capacity satisfies the storage requirement of the electronic device, removing one or more of the plurality of memories may be allowed; if the current storage capacity does not satisfy the storage requirement of the electronic device, removing one or more of the plurality of memories may be prohibited.

Specifically, the storage requirement of the electronic device may be represented by the storage requirement of the electronic device; that is, determining, by the processor, whether the current storage capacity is greater than the storage requirement of the electronic device. And if the current storage capacity is greater than the storage requirement of the electronic device, removing one or more of the plurality of memories may be allowed; if the current amount of storage is less than or equal to the storage requirement of the electronic device, removing one or more of the plurality of memories may not be allowed.

It should be noted that, in some embodiments, when removals are allowed, the amount of the allowed removals may be limited; that is, the current storage capacity subtracted by the storage requirement of the electronic device, equals to the extra storage. The number of the allowed removals can be determined based on the extra storage and the storage capacity of each memory.

In some embodiments, the component may include a power supply. Correspondingly, the processor may be specifically configured to determine a total output power of power supplies in the electronic device, acquire an operating state of the electronic device, and determine whether to allow one or more of the plurality of power supplies to be removed, based on whether the total output power of the power supplies to the electronic device satisfies the current output power of the electronic device.

The total output power of the power supplies is the sum of the output power of all power supplies connected to the electronic device. That is, when the total output power is greater than the current output power, removing one or more of the plurality of power supplies may be allowed; when the total output power is less than or equal to the current output power, removing one or more of the plurality of power supplies may be prohibited.

In some embodiments, the component may include a hard disk. Correspondingly, the processor may be specifically configured to determine a number of hard disks currently in a normal operating state or a number of hard disks in an abnormal operating state in the electronic device; acquire an operating state of the electronic device; and determine whether to allow one or more of the plurality of hard disks may be removed, based on the number of the hard disks in the normal operating state or the number of the hard disks in the abnormal operating state and the operating state of the electronic device.

A hard disk in a normal operating state may include a hard disk that is not removed and operates properly.

A hard disk in an abnormal operating state may include a hard disk that is removed and a hard disk that does not operate properly.

Specifically, the operating state of the electronic device may include a required number of normal hard disks. Then, the processor may determine whether the number of the hard disks currently in the normal operating state in the electronic device is greater than the number of the normal hard disks required by the electronic device. If greater than, removing one or more of the plurality of hard disks may be allowed; if less than or equal to, removing one or more of the plurality of hard disks may not be allowed.

Specifically, the operating state of the electronic device may include a number of abnormal hard disks allowed by the electronic device. Then the processor may determine whether the number of the hard disks currently in the abnormal operating state in the electronic device is less than the number of the abnormal hard disks allowed by the electronic device. If less than, it is indicated that removing one or more of the plurality of hard disks may be allowed; if greater than or equal to, it is indicated that removing one or more of the plurality of hard disks may not be allowed.

When a hard disk in electronic device does not operate properly or a hard disk is removed, the electronic device may record the number of hard disks in the abnormal operating state. The number of hard disks in the normal operating state can be acquired based on the total number of the hard disks in the electronic device subtracted by the number of the hard disks in the abnormal operating state. Or, by directly counting the number of the hard disks currently in the normal operating state or the number of the hard disks in the abnormal operating state in the electronic device, the number of the hard disks currently in the normal operating state or the number of the hard disks in the abnormal operating state may be acquired.

It should be noted that the foregoing hard disks may be a hard disk that stores information and may also be a hard disk that backs up information stored in another hard disk; that is, the information stored in one hard disk is backed up in another hard disk. Then, in the electronic device, for a hard disk in which the key information is stored and is not backed up, the processor may be further configured to prohibit the first hard disk which stores the key information from being removed, or to allow the first hard disk to be removed when determining that the key information stored in the first hard disk is backed up in another hard disk.

In some embodiments, the processor may be further configured to determine a first component that is abnormal and/or damaged from the plurality of components, and control the first component to eject.

When it is determined that among the components, a first component is abnormal and/or damaged, the first component may be controlled to directly eject, to remind the user to replace the component in time.

The various embodiments in the present disclosure are described in a progressive manner. Each embodiment focuses on differences from other embodiments, and the same similar parts between the various embodiments may be referred to each other. Since the device disclosed in the present disclosure corresponds to the method disclosed, the description for the device is relatively simple, and the relevant parts can be referred to the method part in the present disclosure.

Figure 12:
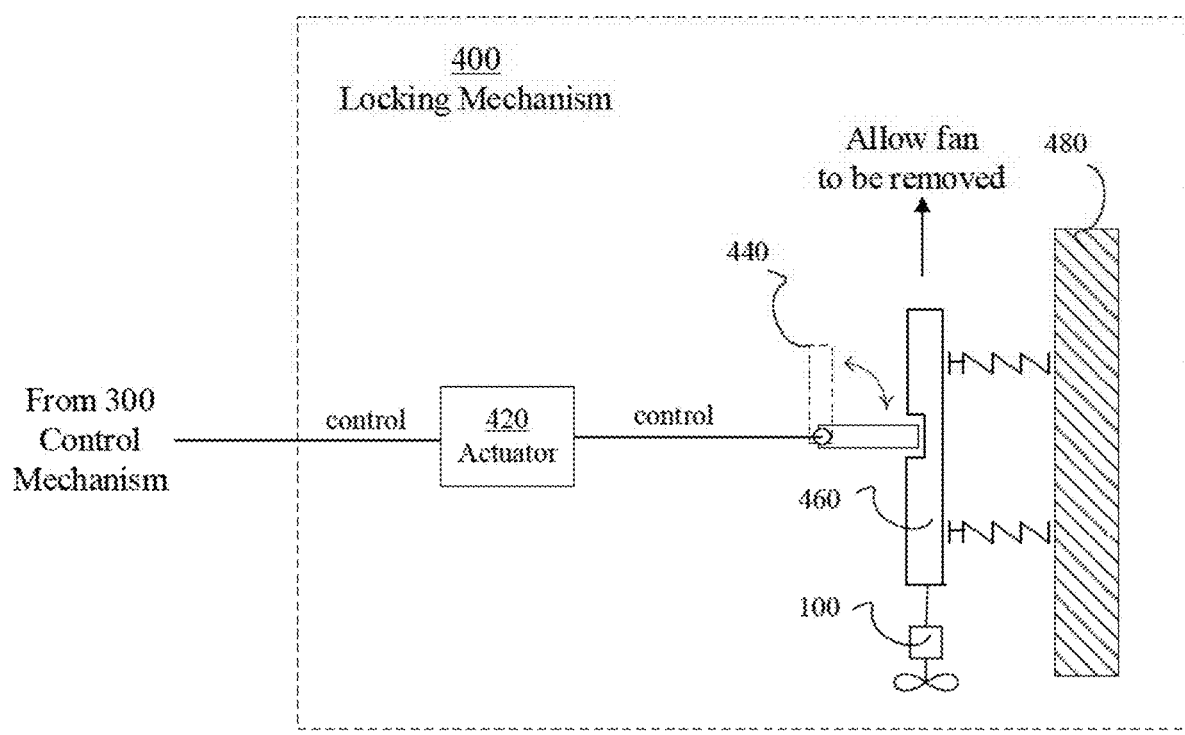
FIG. 12 is a schematic structural diagram of an exemplary locking mechanism according to certain embodiments of the present disclosure.

Referring to FIG. 12, an exemplary locking mechanism 400 of electronic device in FIG. 11 is herein described. As can be seen, the locking mechanism 400 may be disposed at each of the components, such as a cooling fan 100. The control mechanism 300 may be configured to control the locking mechanism 400, and to cause the locking mechanism 400 to be in a locked state by a first action when the locking mechanism 400 is an unlocked state. The first action is to move a lock pin 440 into a slot of a fan holder 460 which causes the locking mechanism 400 to be in a locked state, for which the cooling fan is not removable. Similarly, a second action triggered by the control mechanism 300 when the locking mechanism 400 is in a locked state, is to move the lock pin 440 out of the slot of the fan holder 460. The cooling fan 100 can now be removed from the electronic device.

The above description of the disclosed embodiments enables those skilled in the art to make or use the present disclosure. Various modifications to these embodiments may be obvious to those skilled in the art, and the general principles defined herein may be implemented in other embodiments without departing from the spirit or scope of the present disclosure. Therefore, the present disclosure is not to be limited to the embodiments shown herein and is in accordance with the broadest scope of the principles and features in the present disclosure.

What is claimed is:

1. A control method, comprising:
determining a first state of a plurality of components including cooling devices and memories in an electronic device, the plurality of components being disposed in the electronic device and being removable from the electronic device;
acquiring a first operating state of the electronic device;
determining whether to allow one or more of the plurality of components to be removed based on the first state of the plurality of components and the first operating state of the electronic device; and
unlocking a locking mechanism disposed at each of the plurality of the components by an action from a locked state to an unlocked state controlled by a control mechanism, in response to the one or more of the plurality of components being allowed to be removed, wherein the locked state is configured to prevent the component from being removed from the electronic device.

2. The control method according to claim 1, further comprising: maintaining a locking mechanism in an unlocked state, in response to one or more of the plurality of components being allowed to be removed.

3. The control method according to claim 1, further comprising: moving the locking mechanism to be into the locked state from the unlocked state by a control mechanism, in response to none of the plurality of components being allowed to be removed.

4. The control method according to claim 1, further comprising: maintaining the locking mechanism in the locked state in response to none of the plurality of components being allowed to be removed.

5. The control method according to claim 1, wherein the method further comprises determining that one of a first number of cooling devices are in a normal operating state in the electronic device and a second number of cooling devices are in an abnormal operating state.

6. The control method according to claim 5, wherein one or more of the plurality cooling devices in the electronic device are allowed to be removed in response to a heat dissipation requirement of the electronic device being met by heat dissipation capacity of the plurality of cooling devices in the electronic device.

7. The control method according to claim 1, wherein the method comprises determining a storage capacity of a plurality of the memories in the electronic device.

8. The control method according to claim 7, wherein one or more of the memories in the electronic device are allowed to be removed in response to a storage requirement of the electronic device being met by the storage capacity of the plurality of memories in the electronic device.

9. The control method according to claim 1, further comprising:
determining a first component in the plurality of components to be abnormal or damaged; and
ejecting the first component.

10. An electronic device, comprising:
a plurality of components including cooling devices and memories;
a processor configured to: determine a first state of the plurality components disposed in the electronic device and being removable from the electronic device; acquire a first operating state of the electronic device; and determine whether to allow one or more of the plurality of components to be removed based on the first state of the plurality of components and the first operating state of the electronic device; and
unlock a locking mechanism disposed at each of the plurality of the components by an action from a locked state to an unlocked state controlled by a control mechanism, in response to the one or more of the plurality of the plurality of components being allowed to be removed, wherein the locked state is configured to prevent the component from being removed from the electronic device.

11. The electronic device according to claim 10, further comprises:
the locking mechanism, and
the control mechanism,
wherein the processor is further configured to maintain a state of the locking mechanism and control an action of the control mechanism.

12. The electronic device according to claim 11, wherein the processor maintains an unlocked state of the locking mechanism in response to one or more of the plurality components being allowed to be removed and the locking mechanism being in an unlocked state.

13. The electronic device according to claim 11, wherein the processor controls the control mechanism to move the locking mechanism to be into the locked state in response to none of the plurality of components being allowed to be removed and the locking mechanism being in the unlocked state.

14. The electronic device according to claim 11, wherein the processor maintains the locked state of the locking mechanism in response to none of the plurality of components being allowed to be removed and the locking mechanism being in the locked state.

15. The electronic device according to claim 10, wherein: the processor determines one of: a first number of cooling devices in a normal operating state in the electronic device and a second number of cooling devices in an abnormal operating state; and one or more of a plurality cooling devices in the electronic device are allowed to be removed in response to a heat dissipation requirement of the electronic device being met by heat dissipation capacity of the plurality of cooling devices in the electronic device.

16. The electronic device according to claim 10, wherein the processor determines a storage capacity of a plurality of memories in the electronic device; and one or more of the plurality of memories is allowed to be removed in response to a storage requirement of the electronic device being met by the storage capacity of the plurality of memories in the electronic device.

* * * * *